(12) United States Patent
Cai (10) Patent No.: US 12,396,133 B2
(45) Date of Patent: Aug. 19, 2025

(54) HEAT SINK FOR HANDHELD GAME CONSOLE

(71) Applicant: SHENZHEN DEONE INNOVATION TECHNOLOGY CO., LTD, Shenzhen (CN)

(72) Inventor: Jiongjun Cai, Shenzhen (CN)

(73) Assignee: SHENZHEN DEONE INNOVATION TECHNOLOGY CO., LTD, Shenzhen (CN)

( * ) Notice: Subject to any disclaimer, the term of this patent is extended or adjusted under 35 U.S.C. 154(b) by 217 days.

(21) Appl. No.: 18/346,972

(22) Filed: Jul. 5, 2023

(65) Prior Publication Data
US 2024/0244794 A1  Jul. 18, 2024

(30) Foreign Application Priority Data
Jan. 18, 2023 (CN) .......................... 202320114870.6

(51) Int. Cl.
H05K 7/20 (2006.01)
A63F 13/90 (2014.01)
A63F 13/98 (2014.01)
G06F 1/20 (2006.01)

(52) U.S. Cl.
CPC ........... *H05K 7/2039* (2013.01); *A63F 13/98* (2014.09); *H05K 7/20154* (2013.01); *H05K 7/20209* (2013.01)

(58) Field of Classification Search
CPC ............ H05K 7/2039; H05K 7/20154; H05K 7/20209; A63F 13/98

USPC ......................................................... 361/697
See application file for complete search history.

(56) References Cited

U.S. PATENT DOCUMENTS

| | | | | |
|---|---|---|---|---|
| 5,171,183 A * | 12/1992 | Pollard | ................ | G11B 33/142 |
| 5,704,212 A * | 1/1998 | Erler | ...................... | F25B 21/04 |
| | | | | 361/679.48 |
| 5,898,568 A * | 4/1999 | Cheng | .................. | H05K 5/0273 |
| | | | | 415/203 |
| 6,034,871 A * | 3/2000 | Cheng | ..................... | G06F 1/203 |
| | | | | 165/104.34 |
| 6,104,607 A * | 8/2000 | Behl | ....................... | G06F 1/203 |
| | | | | 415/213.1 |
| 6,141,214 A * | 10/2000 | Ahn | ........................ | G06F 1/203 |
| | | | | 361/679.48 |
| 6,459,575 B1 * | 10/2002 | Esterberg | ................ | G06F 1/203 |
| | | | | 165/185 |
| 6,781,833 B2 * | 8/2004 | Lu | ............................ | G06F 1/20 |
| | | | | 361/756 |

(Continued)

*Primary Examiner* — Anatoly Vortman
(74) *Attorney, Agent, or Firm* — HOWARD M COHN and Associates, LLC (57) ABSTRACT

A heat sink for a handheld game console is provided. The handheld game console includes a handheld game console body and heat dissipating holes defined on one side of the handheld game console body. The heat sink includes a heat sink housing, an air inlet defined on a surface of the heat sink housing, an air outlet defined on the surface of the heat sink housing, a heat dissipating fan arranged in the heat sink housing, and a circuit board arranged in the heat sink housing. A flow guide groove is formed between the air inlet and the air outlet. The heat dissipating fan is connected to the flow guide groove to form a flow guide cavity. The air inlet is connected to the heat dissipating holes on the one side of the handheld game console body.

8 Claims, 8 Drawing Sheets

(56) References Cited

U.S. PATENT DOCUMENTS

| | | | | |
|---|---|---|---|---|
| 6,826,047 B1 * | 11/2004 | Chen | .................. | G06F 1/203 |
| | | | | 361/679.48 |
| 6,837,058 B1 * | 1/2005 | McEuen | ................ | G06F 1/203 |
| | | | | 361/679.48 |
| 7,325,406 B2 * | 2/2008 | Lee | ..................... | G06F 1/20 |
| | | | | 62/3.2 |
| D568,411 S * | 5/2008 | Navid | ..................... | D21/333 |
| 7,564,681 B2 * | 7/2009 | Chen | ..................... | G06F 1/20 |
| | | | | 361/695 |
| 7,619,887 B2 * | 11/2009 | Koch | ................ | H05K 7/20781 |
| | | | | 361/689 |
| 7,859,840 B2 * | 12/2010 | Chang | ................ | G06F 1/1632 |
| | | | | 361/695 |
| 7,948,754 B2 * | 5/2011 | Huang | ................ | G06F 1/203 |
| | | | | 361/679.48 |
| 8,405,973 B2 * | 3/2013 | Huang | ................ | G06F 1/203 |
| | | | | 415/203 |
| 8,926,414 B1 * | 1/2015 | Kirkpatrick | ............ | G06F 1/203 |
| | | | | 361/679.41 |
| D893,499 S * | 8/2020 | Kirkpatrick | ................ | D14/447 |
| D983,208 S * | 4/2023 | Kirkpatrick | ................ | D14/447 |
| D995,750 S * | 8/2023 | Ou | ................ | D23/370 |
| 2007/0253162 A1 * | 11/2007 | Naghi | ................ | F04D 29/601 |
| | | | | 361/695 |
| 2008/0186673 A1 * | 8/2008 | Hsu | ................ | H05K 7/20536 |
| | | | | 361/679.46 |
| 2014/0233183 A1 * | 8/2014 | Horng | ................ | G06F 1/203 |
| | | | | 361/692 |
| 2016/0066477 A1 * | 3/2016 | Liu | ................ | G06F 1/1656 |
| | | | | 29/890.035 |

* cited by examiner

HEAT SINK FOR HANDHELD GAME CONSOLE

TECHNICAL FIELD

The present disclosure relates to a technical field of handheld game consoles, and in particular to a heat sink for a handheld game console.

BACKGROUND

A handheld game console is also known as a portable game console, a portable gamepad, or a portable game console. Since the handheld game console is portable and brings entertainment for people in a short period of time (such as waiting for a bus, waiting in line), the handheld game console is favored by consumers. The handheld game console generates heat when the handheld game console is operated, and the heat is easy to accumulate in a housing of the handheld game console. If the heat is not dissipated in time, the handheld game console may work under a high temperature environment, shortening the service life of components inside the handheld game console, and even damaging the handheld game console in serious cases.

The handheld game console in the prior art generally dissipates heat inside a main body of the handheld game console through heat dissipating holes on a housing of the handheld game console. Such heat dissipation method mainly realizes heat dissipation inside the housing through molecular thermal movement to make molecules overflow. However, only part of the heat inside the main body of the handheld game console is dissipated by adopting the heat dissipation method. Therefore, how to provide a heat dissipation device to make the handheld game machine dissipate heat thoroughly and timely is a problem that the technical person in the field needs to solve urgently.

SUMMARY

In view of this, the present disclosure provides a heat sink for a handheld game console. By defining a flow guide groove between the air inlet and air outlet of the heat sink for the handheld game console, a heat dissipating fan is communicated with the flow guide groove to form a flow guide cavity, so that the air inlet is matched with and connected to heat dissipating holes on one side of a handheld game console body, which in turn enables heat inside the handheld game console to be completely discharged from the heat sink housing in time, thereby effectively avoiding the handheld game console from being under a high temperature environment for a long time. Therefore, shortening of service life of components inside the handheld game console and burning out of the handheld game console are avoided.

The present disclosure provides the heat sink for the handheld game console. The handheld game console comprises a handheld game console body and heat dissipating holes defined on one side of the handheld game console body. The heat sink comprises a heat sink housing, an air inlet defined on a surface of the heat sink housing, an air outlet defined on the surface of the heat sink housing, a heat dissipating fan arranged in the heat sink housing, and a circuit board arranged in the heat sink housing.

A flow guide groove is formed in the heat sink housing. The flow guide groove is communicated with the air inlet and the air outlet. The heat dissipating fan is connected to the flow guide groove to form a flow guide cavity. The air inlet is connected to the heat dissipating holes on the one side of the handheld game console body.

Furthermore, the heat dissipating fan comprises a heat dissipating fan shell and fan blades. The heat dissipating fan shell comprises an air inlet flow guide port and an air outlet flow guide port. The fan blades face the air inlet flow guide port. The air inlet flow guide port faces the air inlet. The air outlet flow guide port faces the air outlet. The air inlet flow guide port is communicated with the flow guide groove to form the flow guide cavity.

Furthermore, the heat sink housing comprises a bottom shell and a top cover. The bottom shell and the top cover are connected to form an accommodating cavity. The heat dissipating fan and the circuit board are arranged in the accommodating cavity. An outer side surface of the bottom shell is attached to the handheld game console body. Furthermore, the flow guide groove is defined on an inner surface of the bottom shell. The inner surface faces the top cover. The air inlet flow guide port is communicated with the flow guide groove to form the flow guide cavity.

Furthermore, the air inlet flow guide port is attached to a rim of the flow guide groove to form the flow guide cavity.

Furthermore, the air inlet is defined on the bottom shell. The air inlet is matched with and communicated with the heat dissipating holes on the one side of the handheld game console body.

Furthermore, the air outlet is defined on the bottom shell. The air outlet is away from the air inlet.

Furthermore, a fan speed regulator is arranged on the circuit board, and the fan speed regulator is configured to adjust a rotation speed of the heat dissipating fan.

Compared with the prior art, in the heat sink for the handheld game console of the present disclosure, by defining the flow guide groove between the air inlet and air outlet of the heat sink for the handheld game console, the heat dissipating fan is communicated with the flow guide groove to form the flow guide cavity, so that the air inlet is communicated with the heat dissipating holes on the one side of the handheld game console body. Through rotation of the heat dissipating fan, air inside the handheld game console is introduced into the flow guide cavity, and the heat dissipating fan accelerates and guides the air, so that the air is discharged through the air outlet, which in turn enables heat inside the handheld game console to be completely discharged from the heat sink housing in time, thereby effectively avoiding the handheld game console from being under the high temperature environment for a long time. Therefore, shortening of the service life of the components inside the handheld game console and burning out of the handheld game console are avoided.

DETAILED DESCRIPTION

In order to well understand the purpose, structure, features and functions of the present disclosure, a heat sink for a handheld game console of the present disclosure will be further described in conjunction with the accompanying drawings and specific embodiments.

As shown in FIGS. 1-9, the present disclosure provides the heat sink for the handheld game console. The handheld game console comprises a handheld game console body 10 and heat dissipating holes 101 defined on one side of the handheld game console body 10. The heat sink comprises a heat sink housing 20, an air inlet 201 defined on a surface of the heat sink housing 20, an air outlet 202 defined on the surface of the heat sink housing 20, a heat dissipating fan 203 arranged in the heat sink housing 20, and a circuit board 204 arranged in the heat sink housing 20. A flow guide groove 205 is formed on the heat sink housing 20. The flow guide groove 205 is communicated with the air inlet 201 and the air outlet 202. The heat dissipating fan 203 is communicated with the flow guide groove 205 to form a flow guide cavity 28. The air inlet 201 is communicated with the heat dissipating holes 101 on the one side of the handheld game console body 10.

In the embodiment, the handheld game console body 10 comprises four sides, which are respectively a top side, a bottom side, a left side, and a right side. Any two sides arranged opposite to each other, of the four sides, are parallel to each other, and the heat dissipating holes 101 of the handheld game console body 10 are defined on the top side of the handheld game console body 10. Of course, in other embodiments, the heat dissipating holes 101 of the handheld game console body may also be defined on other side of the handheld game console body 10, such as the bottom side, the left side, or the right side of the handheld game console body 10, which is not limited thereto.

The air inlet 201 and the air outlet 202 of the heat sink are defined on the surface of the heat sink housing 20. The heat dissipating fan 203 and the circuit board 204 of the heat sink are arranged inside the heat sink housing 20. The flow guide groove is U-shaped and is formed between the air inlet 201 and the air outlet 202. A rear portion of the flow guide groove 205 is attached to an inner side surface of the heat sink housing 20 to form a closed side surface. A front portion of the flow guide groove 205 defines an open portion. The open portion faces the air inlet 201. A top portion of the flow guide groove 205 defines a top opening. The top opening faces the air outlet 202. The heat dissipating fan 203 is connected to the flow guide groove 205 to form the flow guide cavity 28. Specifically, the heat dissipating fan 203 is communicated with the open portion on the front portion of the flow guide groove 205 to form the flow guide cavity 28. A front surface of the heat dissipating fan 203 faces the open portion. The air inlet 201 is communicated with the heat dissipating holes 101 defined on the one side of the handheld game console body 10. Specifically, the air inlet 201 is aligned with and attached to the heat dissipating holes 101 on the one side of the handheld game console body 10. An opening area of the air inlet 201 is not less than an opening area of the heat dissipating holes 101 on the one side of the handheld game console body 10.

By defining the flow guide groove 205 between the air inlet 201 and air outlet 202 of the heat sink for the handheld game console, the heat dissipating fan 203 is communicated with the flow guide groove 205 to form the flow guide cavity 28, so that the air inlet 201 is communicated with the heat dissipating holes 101 on the one side of the handheld game console body 10. Through rotation of the heat dissipating fan 203, air inside the handheld game console is introduced into the flow guide cavity 28, and the heat dissipating fan 203 accelerates and guides the air, so that the air is discharged through the air outlet 202, which in turn enables heat inside the handheld game console to be completely discharged from the heat sink housing in time, thereby effectively avoiding the handheld game console from being under a high temperature environment for a long time. Therefore, shortening of service life of components inside the handheld game console and burning out of the handheld game console are avoided.

As shown in FIGS. 4-9, the heat dissipating fan 203 comprises a heat dissipating fan shell and fan blades 2031. The heat dissipating fan shell comprises an air inlet flow guide port 231 and an air outlet flow guide port 232. The fan blades 2031 are arranged at the air inlet flow guide port 231. The air inlet flow guide port 231 faces the air inlet 201. The air outlet flow guide port 232 faces the air outlet 202. The air inlet flow guide port 231 is communicated with the flow guide groove 205 to form the flow guide cavity 28.

In the embodiment, the air inlet flow guide port 231 is communicated with the flow guide groove 205 to form the flow guide cavity 28. The heat dissipating fan shell is connected and attached to a rim 240 of the flow guide groove 205. Of course, in other embodiments, the air inlet flow guide port 231 is clamped with the flow guide groove 205 or the air inlet flow guide port 231 is connected to the flow guide groove 205 by another connection mode, which is not limited thereto. Through rotation of the fan blades 2031, the air inside the handheld game console is introduced into the flow guide cavity 28, and the heat dissipating fan 203 accelerates and guides the air, so that the air is discharged through the air outlet 202, which in turn enables the heat inside the handheld game console to be completely discharged from the heat sink housing.

Figure 8:
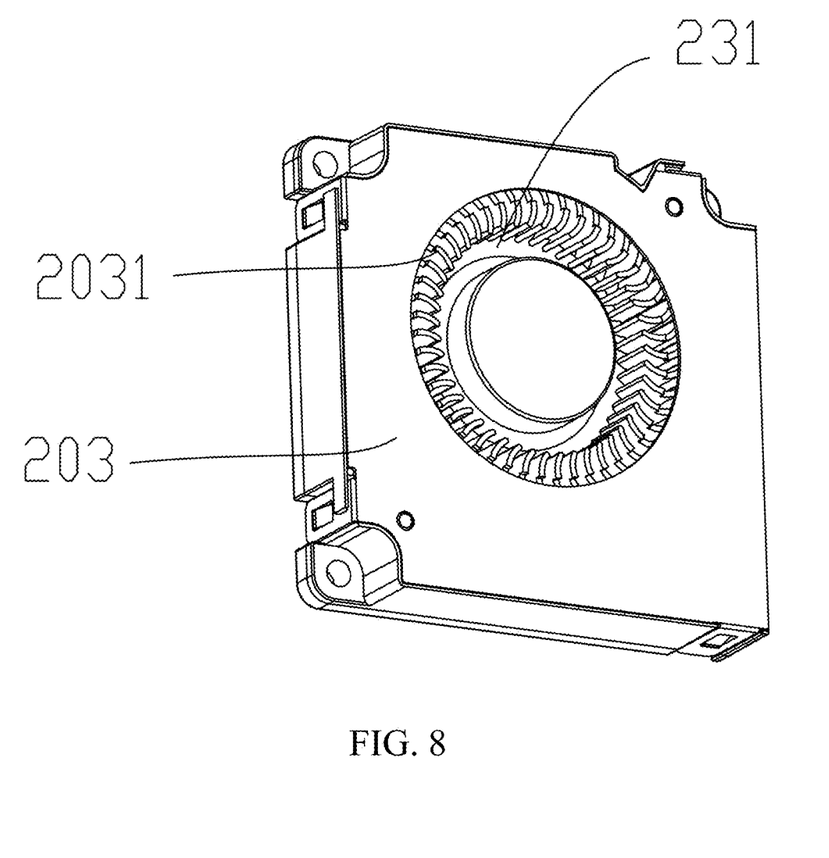
FIG. 8 is a schematic diagram of a heat dissipating fan according to one embodiment of the present disclosure.
Figure 9:
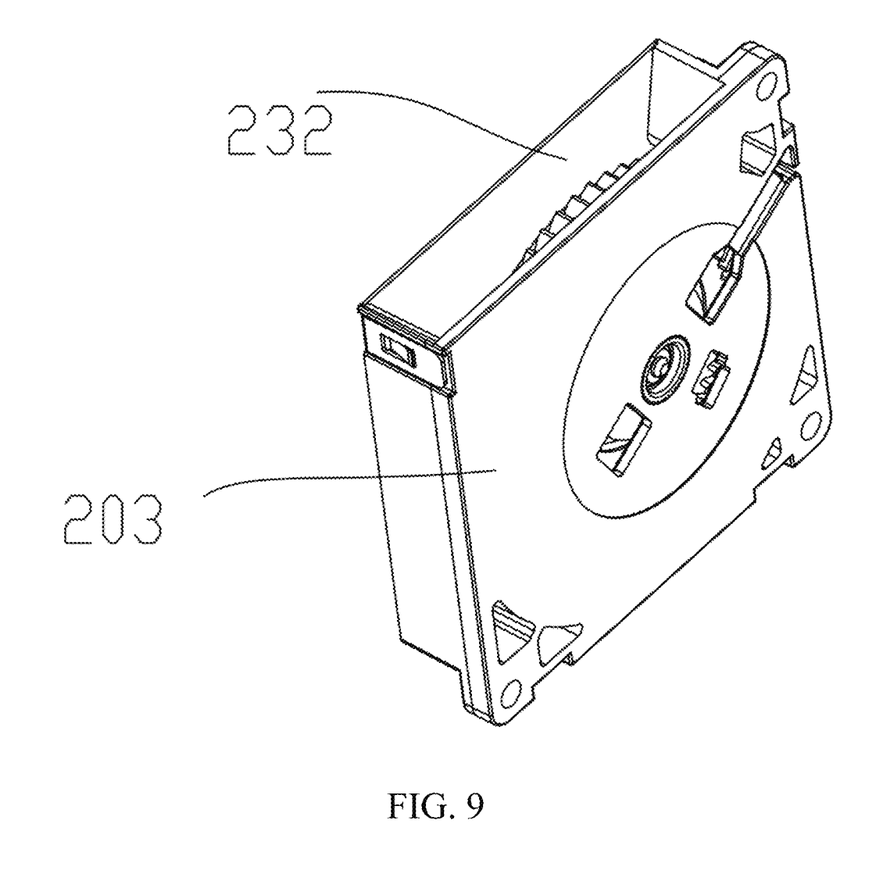
FIG. 9 is another schematic diagram of the heat dissipating fan according to one embodiment of the present disclosure.

In one optional embodiment of the present disclosure, an area of the air inlet flow guide port 231 matches an area of the fan blades 2031. Specifically, the area of the air inlet flow guide port 231 is equal to an area of a circle formed by combining the fan blades 2031. Of course, in other embodiments, the area of the air inlet flow guide port 231 maybe greater than the area of the circle formed by combining the fan blades, or the area of the air inlet flow guide port 231 may be less than the area of the circle formed by combining the fan blades, which is not limited thereto.

Figure 1:
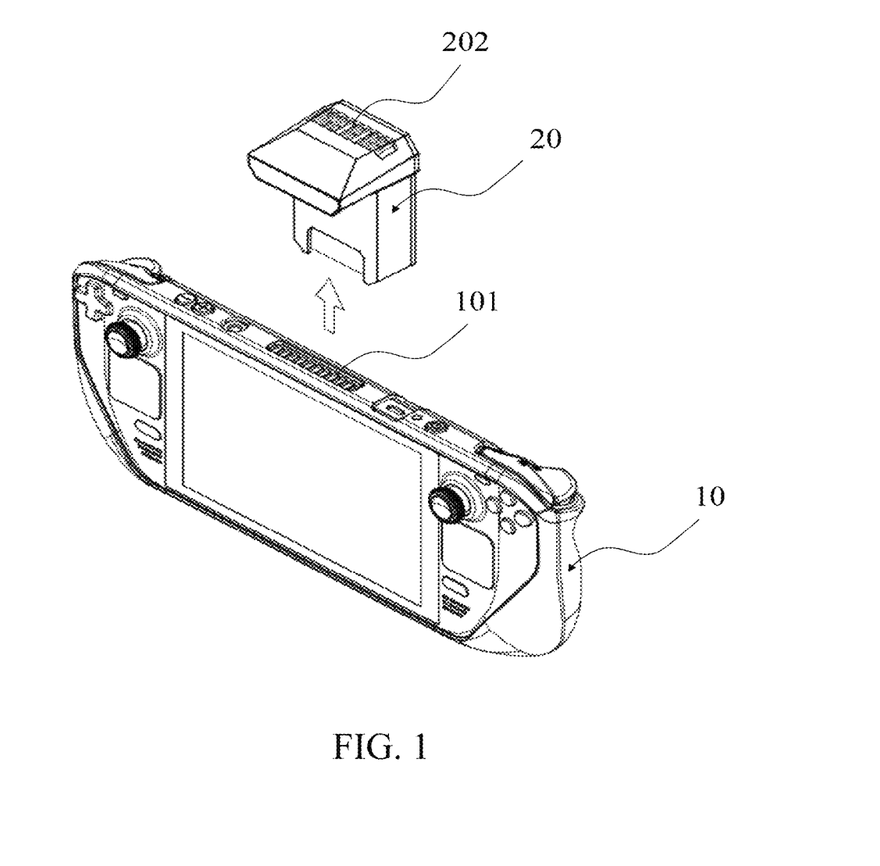
FIG. 1 is a schematic diagram of a heat sink for a handheld game console according to one embodiment of the present disclosure where the heat sink is to be assembled to the handheld game console.
Figure 2:
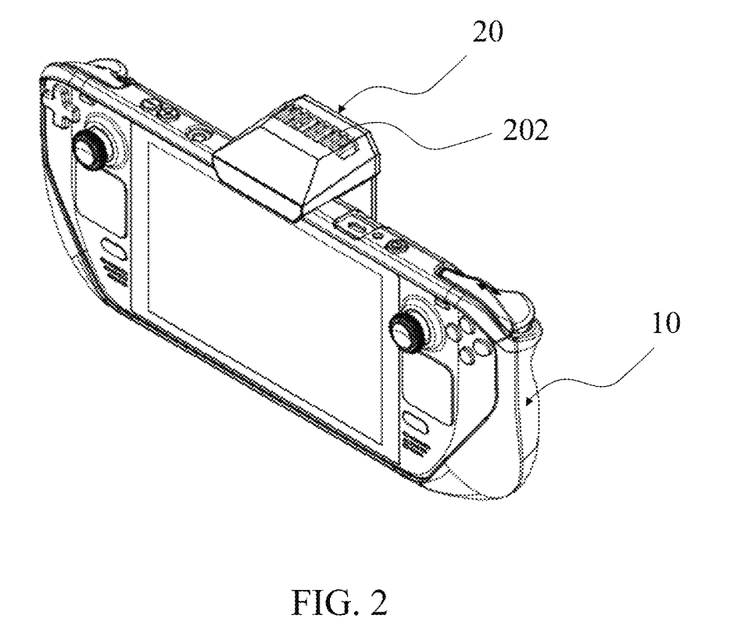
FIG. 2 is a schematic diagram of the heat sink for the handheld game console according to one embodiment of the present disclosure where the heat sink is assembled to the handheld game console.
Figure 3:
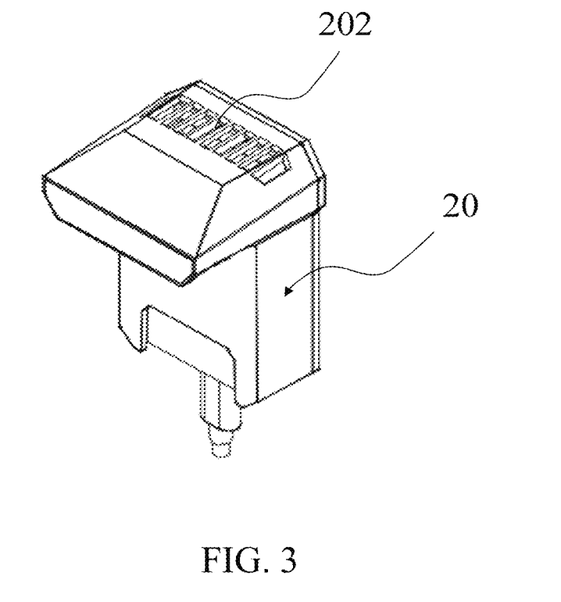
FIG. 3 is a structural schematic diagram of the heat sink for the handheld game console according to one embodiment of the present disclosure.
Figure 4:
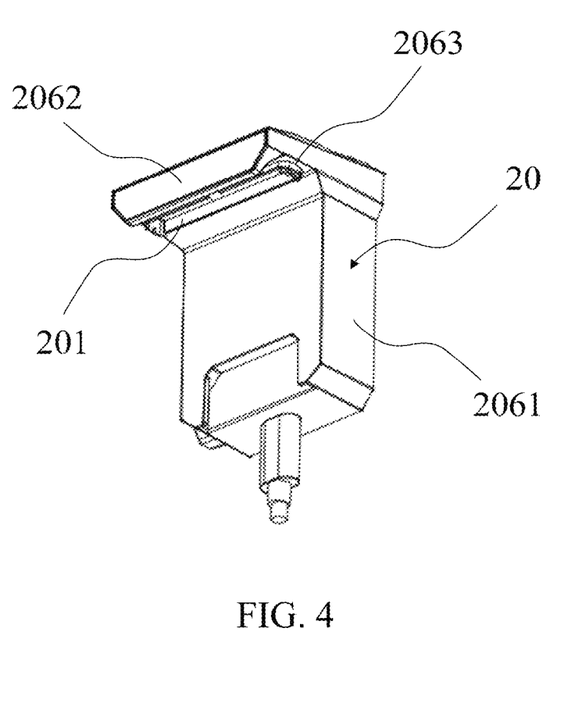
FIG. 4 is another structural schematic diagram of the heat sink for the handheld game console according to one embodiment of the present disclosure.
Figure 5:
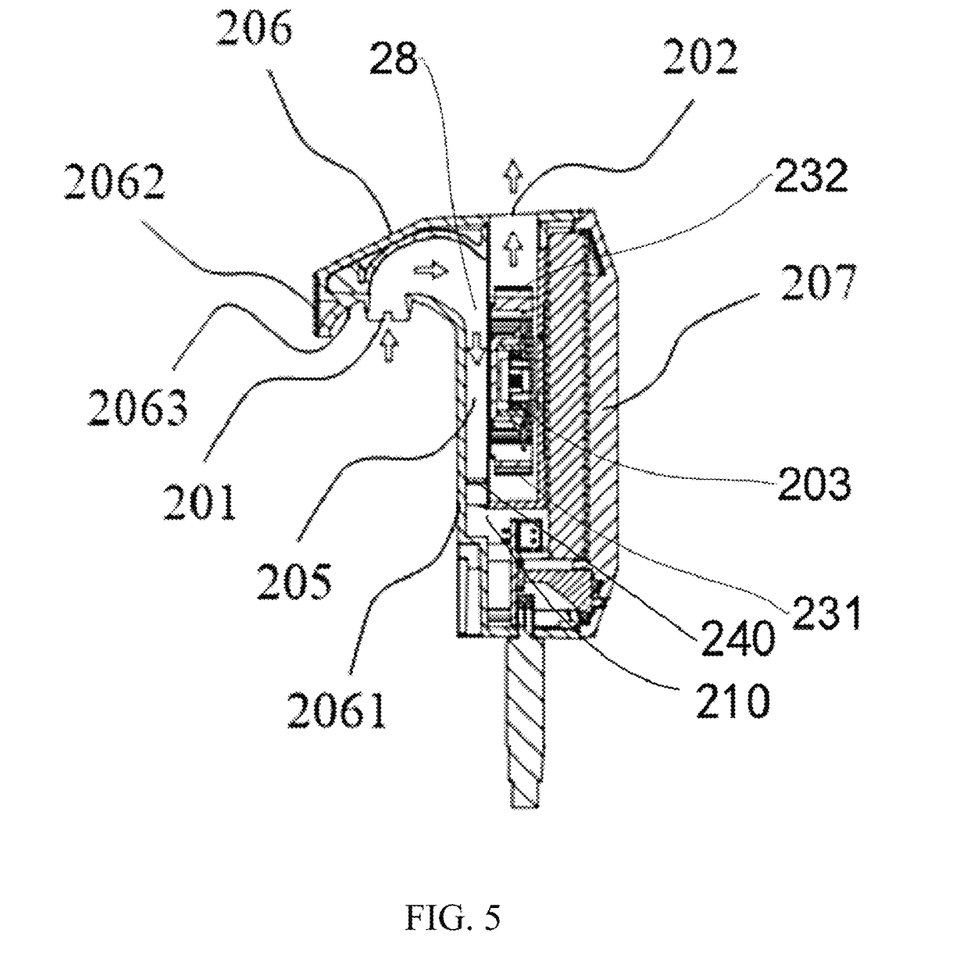
FIG. 5 is a cross-sectional schematic diagram of the heat sink for the handheld game console shown in FIG. 3.
Figure 6:
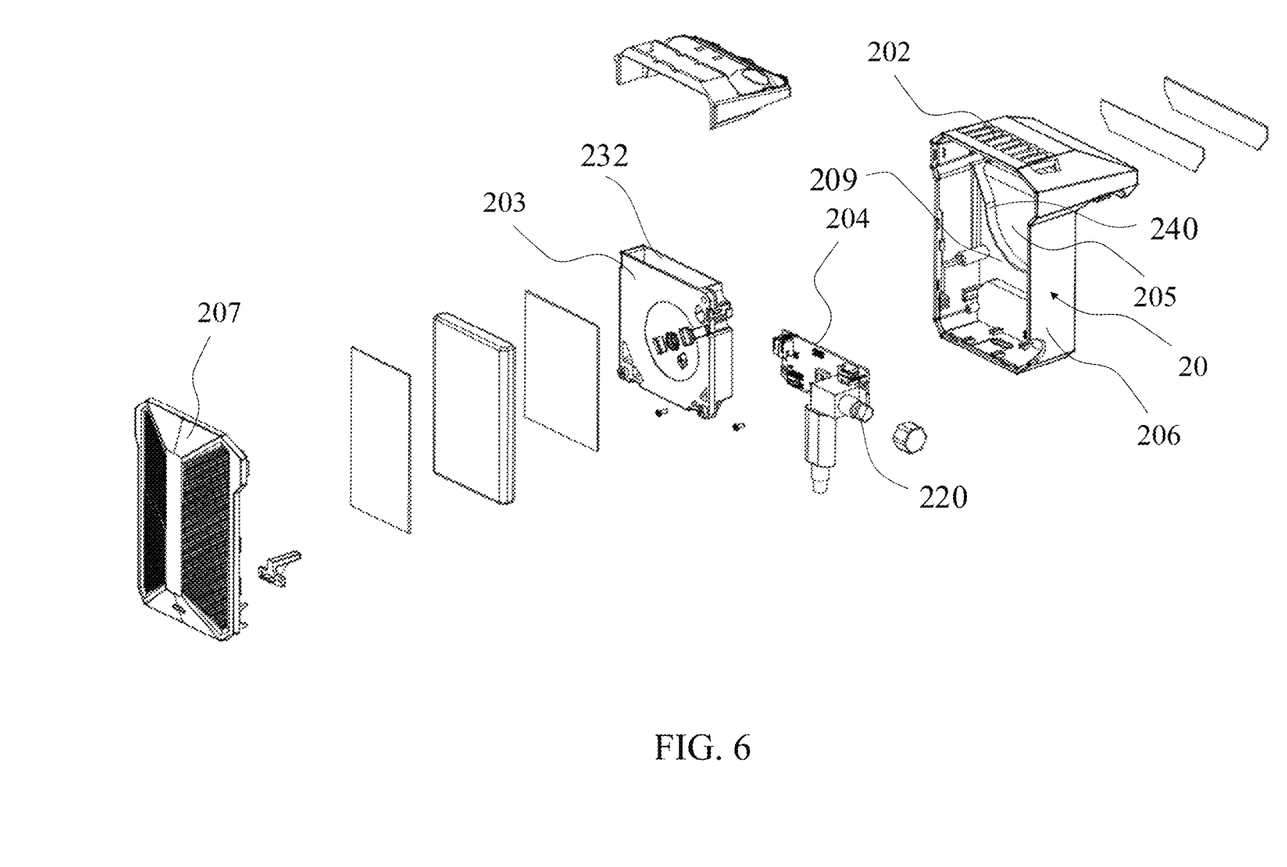
FIG. 6 is an exploded schematic diagram of the heat sink for the handheld game console shown in FIG. 3.
Figure 7:
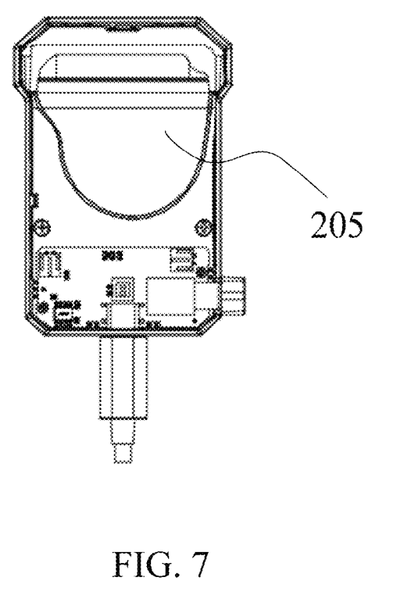
FIG. 7 is a structural schematic diagram of a flow guide groove of the heat sink for the handheld game console according to one embodiment of the present disclosure.

As shown in FIGS. 5-7, the heat sink housing 20 comprises a bottom shell 206 and a top cover 207, the bottom shell 206 and the top cover 207 are connected to form an accommodating cavity 210. The bottom shell 206 is connected to the top cover 207 through fasteners. Of course, in other embodiments, the bottom shell 206 is clamped with the top cover 207 or the bottom shell 206 is bonded to the top cover 207, which is not limited thereto. The heat dissipating fan 203 and the circuit board 204 are arranged in the accommodating cavity 210. An outer side surface of the bottom shell 206 is attached to the handheld game console body 10. The flow guide groove 205 is defined on an inner surface 209 of the bottom shell 206. The inner surface 209 of the bottom shell faces the top cover 207. The air inlet flow guide port 231 is communicated with the flow guide groove 205 to form the flow guide cavity 28.

In one optional embodiment of the present disclosure, the heat dissipating fan shell is attached to a rim 240 of the flow guide groove 205 to form the flow guide cavity 28. Of course, in other embodiments, the air inlet flow guide port 231 may be connected to the groove surface of the flow guide groove 205 in other forms, e.g., the air inlet flow guide port 231 may be clamped with the groove surface of the flow guide groove 205 or air inlet flow guide port 231 may be embedded in the groove surface of the flow guide groove 205, which is not limited thereto.

As shown in FIGS. 1-6, the air inlet 201 is defined on the bottom shell 206. The air inlet 201 is matched with and communicated with the heat dissipating holes 101 on the one side of the handheld game console body 10. The air outlet 202 is defined on the bottom shell 206. The air outlet 202 is away from the air inlet 201. Of course, in other embodiments, the air inlet 201 may be defined on the bottom shell 206 of the heat sink for the handheld game console, and the air outlet 202 is defined on the top cover 207. Alternatively, the air outlet 202 is defined on the bottom shell 206 and the top cover 207 of the heat sink for the handheld game console, which is not limited thereto.

In the embodiment, the heat sink housing 20 comprises a long portion 2061, a short portion 2062, and a groove 2063 located between the long portion 2061 and the short portion 2062. The short portion 2062 is arranged adjacent to the groove 2063. The groove 2063 is arranged adjacent to the long portion 2061. The long portion 2061, the groove 2063, and the short portion 2062 are sequentially arranged to form an inverted L-shaped structure. The inverted L-shaped structure is snapped on the handheld game console body 10.

In one optional embodiment of the present disclosure, the long portion 2061, the groove 2063, and the short portion 2062 of the heat sink housing 20 are integrally formed. Specifically, the heat sink housing 20 comprises the long portion 2061, the short portion 2062, and the groove 2063 located between the long portion 2061 and the short portion 2062. The short portion 2062 is arranged adjacent to the groove 2063. The groove 2063 is arranged adjacent to the long portion 2061. The long portion 2061, the groove 2063, and the short portion 2062 are sequentially arranged to form the inverted L-shaped structure. The bottom shell 206 of the inverted L-shaped structure is snapped on the handheld game console body 10.

Furthermore, the groove 2063 comprises an inner side surface and an outer side surface. The air inlet 201 is defined on a bottom portion of the inner side surface of the groove 2063. The air outlet 202 is defined on the outer side surface of the groove 2063. The inner side surface of the groove 2063 is attached to the one side of the handheld game console body where the heat dissipating holes are defined. The air inlet 201 is attached to the heat dissipating holes defined on the one side of the handheld game console body.

The long portion 2061 comprises a first side surface arranged adjacent to the inner side surface of the groove 2063 and a second side surface arranged adjacent to the outer side surface of the groove 2063. The first side surface of the long portion 2061 is attached to a rear side of the handheld game console body 10.

The short portion 2062 comprises a third side surface arranged adjacent to the inner side surface of the groove 2063 and a fourth side surface arranged adjacent to the outer side surface of the groove 2063. The third side surface is attached to a front side of the handheld game console body 10.

In the embodiment, the heat sink housing 20 is arranged in the inverted L-shaped structure, so that the long portion 2061 of the heat sink housing 20 is attached to the rear side of the handheld game console body 10, and the short portion 2062 is attached to the front side of the handheld game console body 10. Therefore, the handheld game console body 10 is clamped in the groove 2063 of the inverted L-shaped structure of the heat sink housing 20, thereby effectively clamping the handheld game console body 10 and preventing the heat sink from falling off from the handheld game console body 10.

In one optional embodiment of the present disclosure, the heat dissipating fan 203 and the circuit board 204 are arranged in the long portion 2061 of the heat sink housing 20. Specifically, the heat dissipating fan 203 is arranged in an upper half space of the long portion 2061 of the heat sink housing 20. The circuit board 204 is arranged in a lower half space of the long portion 2061 of the heat sink housing 20.

In the embodiment, the heat dissipating fan 203 and the circuit board 204 are arranged in the long portion 2061 of the heat sink housing 20, so that a center of gravity of the heat sink falls on the rear side of the handheld game console body 10, thereby further preventing the heat sink from falling off from the handheld game console body 10 and the heat sink is clamped firmly.

As shown in FIGS. 6-7, a fan speed regulator 220 is arranged on the circuit board 204, and the fan speed regulator 220 is configured to adjust a rotation speed of the heat dissipating fan 203.

In the embodiment, the fan speed regulator 220 is a knob switch. The knob switch is electrically connected to the circuit board 204. The rotation speed of the heat dissipating fan 203 is adjusted by rotating the knob switch.

To sum up, in the heat sink for the handheld game console of the present disclosure, the heat sink housing is arranged in the inverted L-shaped structure, so that the long portion of the heat sink housing is attached to the rear side of the handheld game console body, and the short portion is attached to the front side of the handheld game console body. Therefore, the handheld game console body is clamped in the groove of the inverted L-shaped structure of the heat sink housing. Moreover, the heat dissipating fan and the circuit board are arranged in the long portion of the heat sink housing, so that the center of the gravity of the heat sink falls on the rear side of the handheld game console body, thereby further preventing the heat sink from falling off from the handheld game console body and the heat sink is clamped firmly.

The above detailed description is only a description of optional embodiments of the present disclosure, and does not limit the patent scope of the present disclosure. Therefore, all equivalent technical changes made based on the description and illustrations of the present disclosure are included in the protection scope of the present disclosure.

What is claimed is:

1. A heat sink for a handheld game console defining a handheld game console body and heat dissipating holes defined on one side of the handheld game console body, comprising:

a heat sink housing, an air inlet defined on a surface of the heat sink housing, an air outlet defined on the surface of the heat sink housing, a heat dissipating fan arranged in the heat sink housing, and a circuit board arranged in the heat sink housing;

wherein the heat sink housing comprises a flow guide groove; the flow guide groove is communicated with the air inlet and the air outlet; the heat dissipating fan comprises a heat dissipating fan shell and fan blades; the heat dissipating fan shell comprises an air inlet flow guide port and an air outlet flow guide port; the air inlet flow guide port of the heat dissipating fan is communicated with the flow guide groove to form a flow guide cavity; the air inlet is communicated with the heat dissipating holes on the one side of the handheld game console body;

wherein the air inlet flow guide port faces the air inlet; the air outlet flow guide port faces the air outlet.

2. The heat sink according to claim 1, wherein the fan blades are disposed in the heat dissipating fan shell, and the fan blades face the air inlet flow guide port.

3. The heat sink according to claim 1, wherein the heat sink housing comprises a bottom shell and a top cover; the bottom shell and the top cover are connected to form an accommodating cavity; the heat dissipating fan and the circuit board are arranged in the accommodating cavity; an outer side surface of the bottom shell is attached to the handheld game console body.

4. The heat sink according to claim 3, wherein the flow guide groove is defined on an inner surface of the bottom shell, and the inner surface of the bottom shell faces the top cover.

5. The heat sink according to claim 4, wherein the heat dissipating fan shell is attached to a rim of the flow guide groove to form the flow guide cavity.

6. The heat sink according to claim 3, wherein the air inlet is defined on the bottom shell; the air inlet is matched with and communicated with the heat dissipating holes on the one side of the handheld game console body.

7. The heat sink according to claim 3, wherein the air outlet is defined on the bottom shell; the air outlet is away from the air inlet.

8. The heat sink according to claim 1, wherein a fan speed regulator is arranged on the circuit board, and the fan speed regulator is configured to adjust a rotation speed of the heat dissipating fan.

* * * * *